(12) United States Patent
Seo

(10) Patent No.: US 7,368,346 B2
(45) Date of Patent: May 6, 2008

(54) METHOD FOR FORMING GATE STRUCTURE IN FLASH MEMORY DEVICE

(75) Inventor: Il-Seok Seo, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 155 days.

(21) Appl. No.: 11/317,684

(22) Filed: Dec. 23, 2005

(65) Prior Publication Data

US 2006/0246649 A1    Nov. 2, 2006

(30) Foreign Application Priority Data

Apr. 29, 2005   (KR) .................... 10-2005-0036272

(51) Int. Cl.
*H01L 21/336* (2006.01)
(52) U.S. Cl. .................. 438/257; 438/211; 438/296; 438/424; 257/E27.001; 257/E29.129; 257/E21.179
(58) Field of Classification Search ............ 438/296, 438/212, 257, 424, 211; 257/E27.001, E29.129, 257/E21.179, 374
See application file for complete search history.

(56) References Cited

U.S. PATENT DOCUMENTS

| | | | | |
|---|---|---|---|---|
| 6,130,168 A * | 10/2000 | Chu et al. | .................... | 438/717 |
| 6,200,856 B1 * | 3/2001 | Chen | .................... | 438/257 |
| 6,204,149 B1 * | 3/2001 | Batra et al. | .................. | 438/435 |
| 6,838,342 B1 * | 1/2005 | Ding | .................... | 438/257 |
| 6,888,755 B2 * | 5/2005 | Harari | .................... | 365/185.18 |
| 2005/0032306 A1 * | 2/2005 | Ding | .................... | 438/257 |
| 2005/0062095 A1 * | 3/2005 | Hsieh | .................... | 257/320 |
| 2006/0084233 A1 * | 4/2006 | Chang et al. | ................ | 438/296 |

FOREIGN PATENT DOCUMENTS

| | | |
|---|---|---|
| KR | 1998-021363 | 6/1998 |
| KR | 1999-0075948 | 10/1999 |
| KR | 2003-0002721 | 1/2003 |

\* cited by examiner

*Primary Examiner*—Hsien-Ming Lee
*Assistant Examiner*—Shaka Scarlett
(74) *Attorney, Agent, or Firm*—Blakely, Sokoloff, Taylor & Zafman LLP

(57) ABSTRACT

Device isolation insulation layers passing through an insulation layer and a substrate, are formed, and a portion of them is removed. The insulation layer is removed. A gate oxide layer and a first conductive layer sequentially formed over the device isolation insulation layers, are isolated. Portions of the device isolation insulation layers are removed to increase an effective area of the first conductive layer. A laminated layer is formed, over the gate oxide layer and the first conductive layer that are isolated, and a portion of it is removed. A second conductive layer is formed over a remaining portion of the laminated layer, filling a gap created by removing the portion of the laminated layer. Predetermined portions of the second conductive layer are removed, thereby forming gate structures.

10 Claims, 10 Drawing Sheets

“METHOD FOR FORMING GATE STRUCTURE IN FLASH MEMORY DEVICE”

METHOD FOR FORMING GATE STRUCTURE IN FLASH MEMORY DEVICE

FIELD OF THE INVENTION

An embodiment of the invention relates to a method for fabricating a flash memory device and, more particularly, to a method for forming a gate structure in a flash memory device.

DESCRIPTION OF RELATED ARTS

Generally, a flash memory device includes a stack gate structure, wherein the stack gate structure includes a floating gate for storing an electric charge, and a control gate for erasing and programming the stored electric charge. Also, the floating gate must completely cover an active region defined on a substrate to improve reliability of the flash memory device. Thus, in consideration of the relationship between the adjacent gates, an overlay margin between the active region and the floating gate becomes an important variable regarding the flash memory device reliability.

However, as the device technology is becoming highly integrated and the patterns are becoming more and more micronized recently, formation of a gate in a flash memory device seems to be reaching a limit, and it is difficult to secure the overlay margin. Thus, a self-aligned floating gate (SAFG) technology was developed. However, the SAFG technology also showed limitations as described below with the accompanying drawings.

FIGS. 1A to 1H are cross-sectional views illustrating a method for forming a gate in a conventional flash memory device.

As shown in FIG. 1A, a nitride layer 11 is formed on a substrate 10 with a sufficient thickness, and then a photolithography process is performed on the above resulting substrate structure for isolation.

Subsequently, as shown in FIG. 1B, a device isolation insulation layer 12 is formed over the above resulting substrate structure to isolate active regions.

Furthermore, as shown in FIG. 1C, after the device isolation layer 12 is formed, a chemical mechanical polishing (CMP) process is performed to planarize the device isolation insulation layer 12 until the nitride layer 11 is exposed.

Then, as shown in FIG. 1D, the nitride layer 11 is removed by wet or dry etching.

Next, as shown in FIG. 1E, a gate oxide layer 13 and a conductive layer 14 for use in a floating gate is formed sequentially on the above resulting substrate structure where the nitride layer 11 had been removed, and then a CMP process is performed until the gate oxide layer 13 and the conductive layer 14 are isolated. Hereinafter, the isolated conductive layer 14 is referred to as the floating gate.

Subsequently, as shown in FIG. 1F, portions of the device isolation insulation layer 12 are removed by wet or dry etching to increase an effective area of the floating gates 14.

Furthermore, as shown in FIG. 1G, an oxide-nitride-oxide (ONO) layer 15 and a capping conductive layer 16 are formed sequentially on the above resulting substrate structure where portions of the device isolation insulation layer 12 had been removed.

Then, as shown in FIG. 1H, a photoresist layer, although not illustrated, is formed to remove the ONO layer 15, and then predetermined portions of the capping conductive layer 16 and the ONO layer 15 are removed. The reason for removing the capping conductive layer 16 and the ONO layer 15 is because the floating gates 14 and control gates, although not illustrated, have to contact with each other in order to form a source selecting line and a drain selecting line. However, limitations arise herein. Due to the large scale of integration, a space between the floating gates is too narrow. Also, although not illustrated, if the floating gates are formed with a negative slope, the capping conductive layer 16 and the ONO layer 15 are not removed easily, and residual ONO layers 15A and residual capping conductive layers 16A remain on lateral walls of the floating gates 14, and thus a bridge between the floating gates may occur. As a result, an electrical characteristic of the device may be deteriorated.

SUMMARY OF THE INVENTION

A method for forming a gate structure in a flash memory device capable of sufficiently securing an overlay margin between an active region and a gate structure, and also stably removing an ONO layer, is described.

In accordance with an aspect of the present invention, there is provided a method for forming a gate structure in a flash memory device, including: forming device isolation insulation layers passing through an insulation layer and a substrate; removing a predetermined portion of the insulation layer and the device isolation insulation layers; removing the insulation layer; isolating a gate oxide layer and a first conductive layer sequentially formed over the device isolation insulation layers; removing portions of the device isolation insulation layers to increase an effective area of the first conductive layer; forming a laminated layer over the gate oxide layer and the first conductive layer that are isolated; removing a predetermined portion of the laminated layer; forming a second conductive layer over a remaining portion of the laminated layer, filling a gap created by removing the predetermined portion of the laminated layer; and removing predetermined portions of the second conductive layer, thereby forming gate structures.

BRIEF DESCRIPTION OF THE DRAWINGS

The above features will become better understood with respect to the following description of the specific embodiments given in conjunction with the accompanying drawings, in which.

DETAILED DESCRIPTION OF THE INVENTION

A method for forming a gate structure in a flash memory device in accordance with certain embodiments of the present invention will be described in detail with reference to the accompanying drawings.

FIGS. 2A to 2K are cross-sectional views illustrating a method for forming a gate in a flash memory device in accordance with a specific embodiment of the present invention.

Figure 1A:
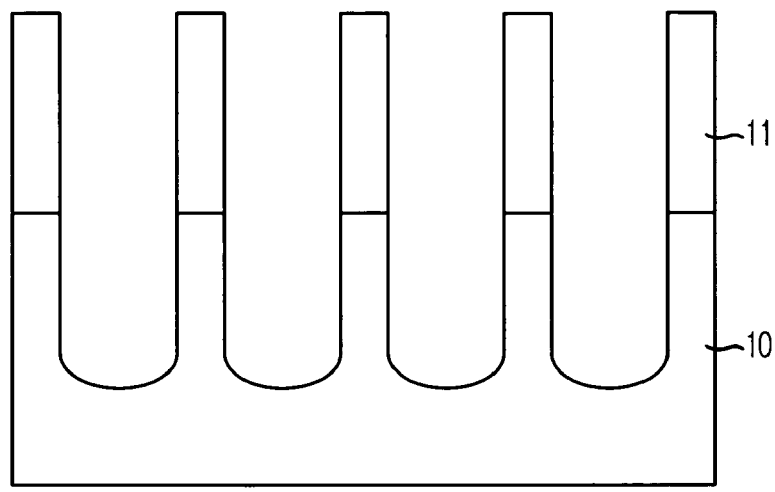
FIGS. 1A to 1H are cross-sectional views illustrating a method for forming a gate in a conventional flash memory device.
Figure 1B:
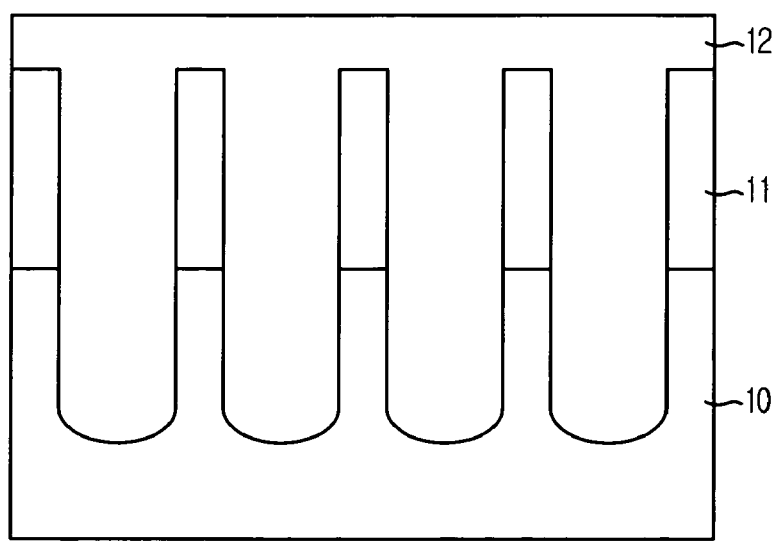
Figure 1C:
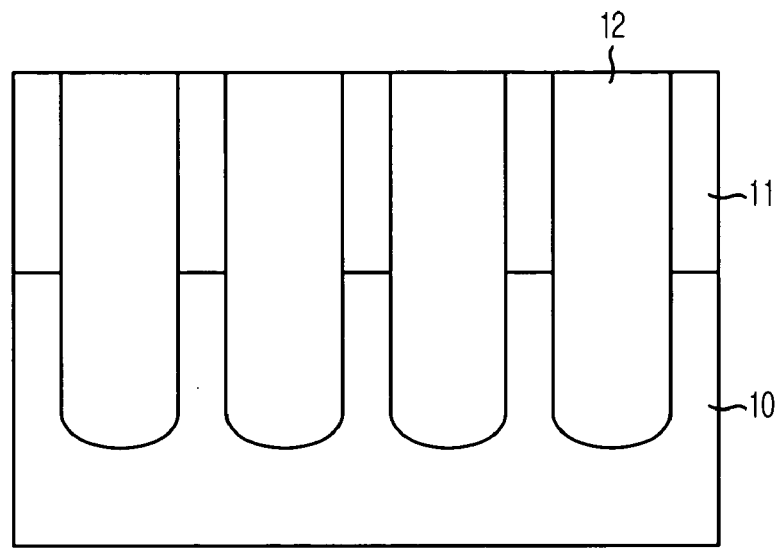
Figure 1D:
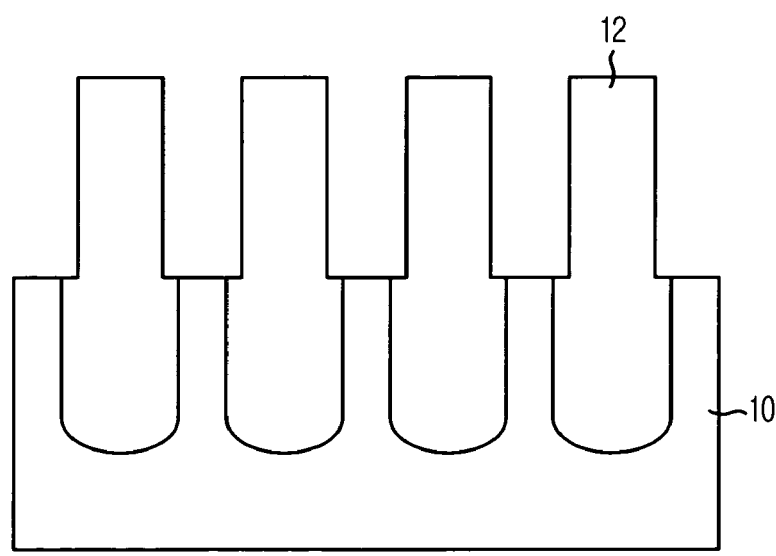
Figure 1E:
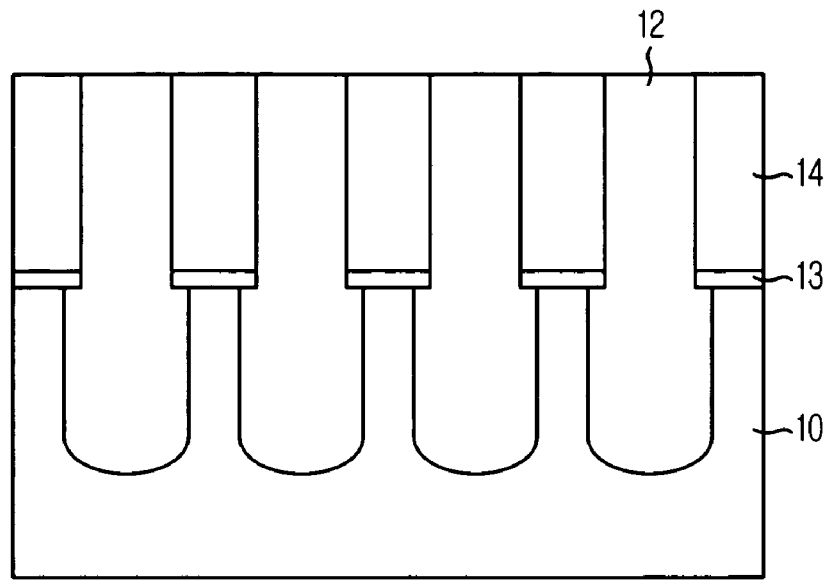
Figure 1F:
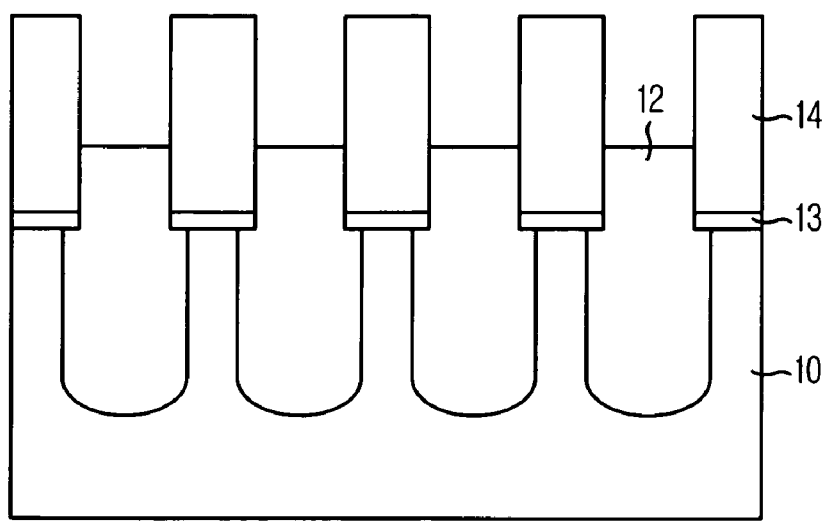
Figure 1G:
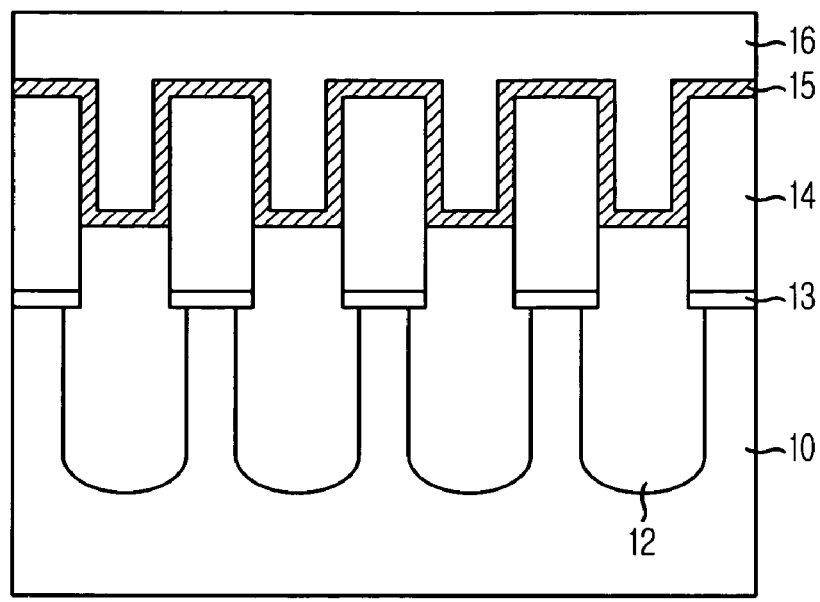
Figure 1H:
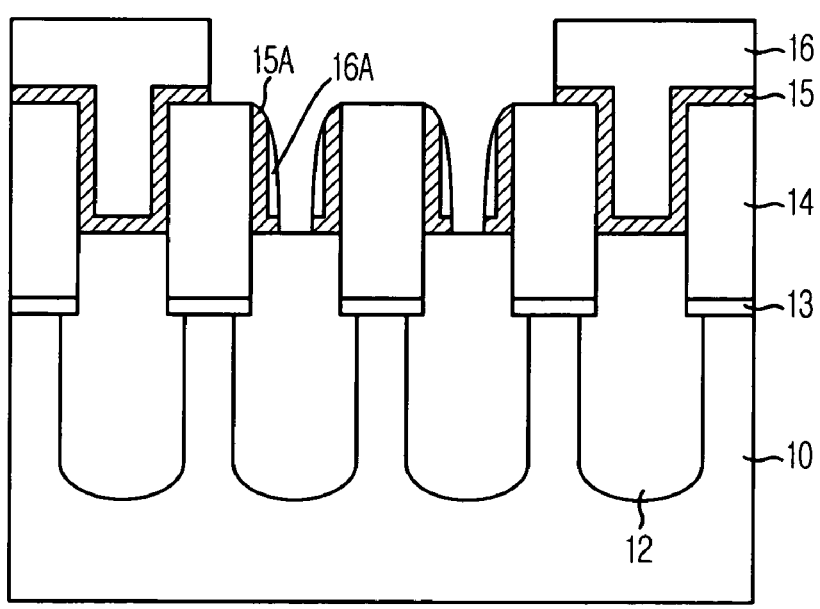
Figure 2A:
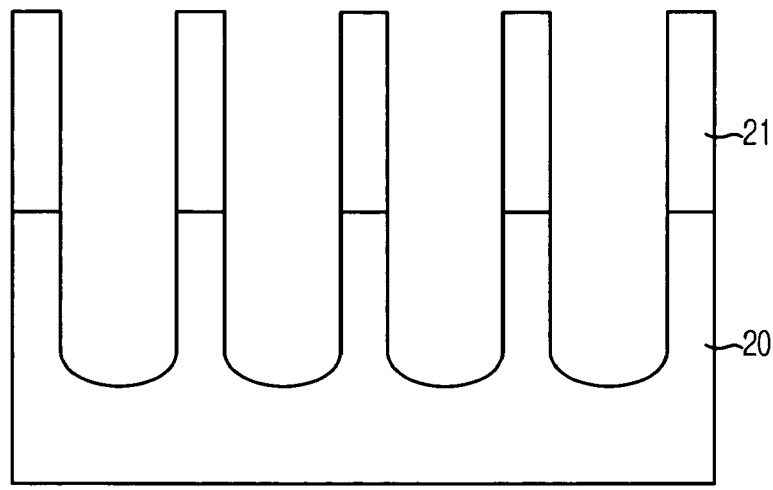
FIGS. 2A to 2K are cross-sectional views illustrating a method for forming a gate structure in a flash memory device in accordance with a specific embodiment of the present invention.

Referring to FIG. 2A, a nitride layer 21 is formed on a substrate 20 with a sufficient thickness, and then a photolithography process is performed on the above resulting substrate structure for isolation.

Figure 2B:
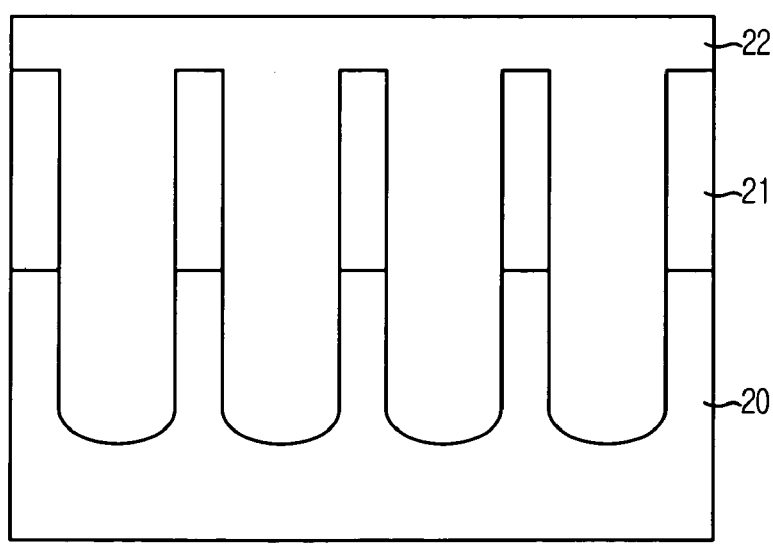

Referring to FIG. 2B, a device isolation insulation layer 22 is formed over the above resulting substrate structure to isolate active regions.

Figure 2C:
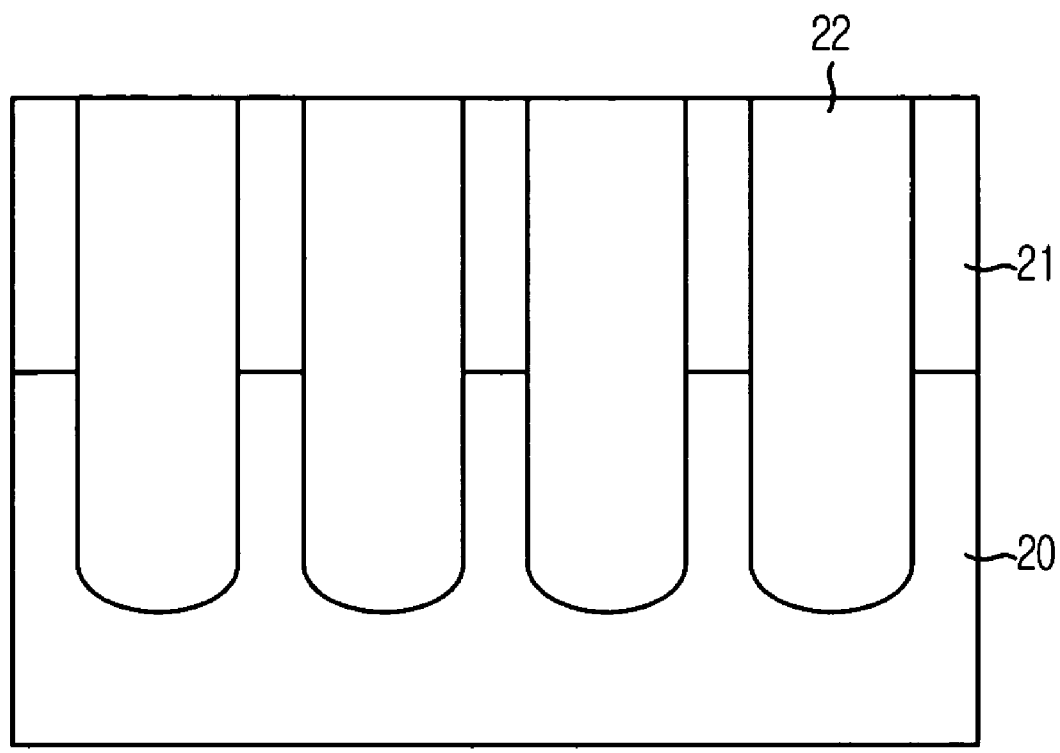

Referring to FIG. 2C, after the device isolation layer 22 is formed, a chemical mechanical polishing (CMP) process is performed to planarize the device isolation insulation layer 22 until the nitride layer 21 is exposed.

Figure 2D:
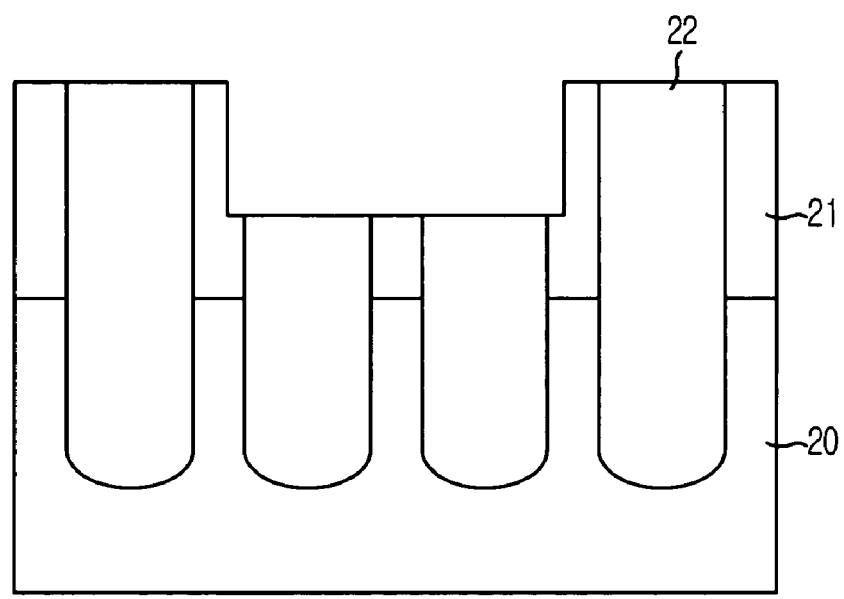

Subsequently, as shown in FIG. 2D, photoresist patterns, although not illustrated, are formed on predetermined portions of the above resulting structure on which selecting lines are to be formed. Next, a predetermined target portion of the nitride layer 21 and the device isolation insulation layer 22 is removed by wet or dry etching. Then, the photoresist patterns are removed.

Figure 2E:
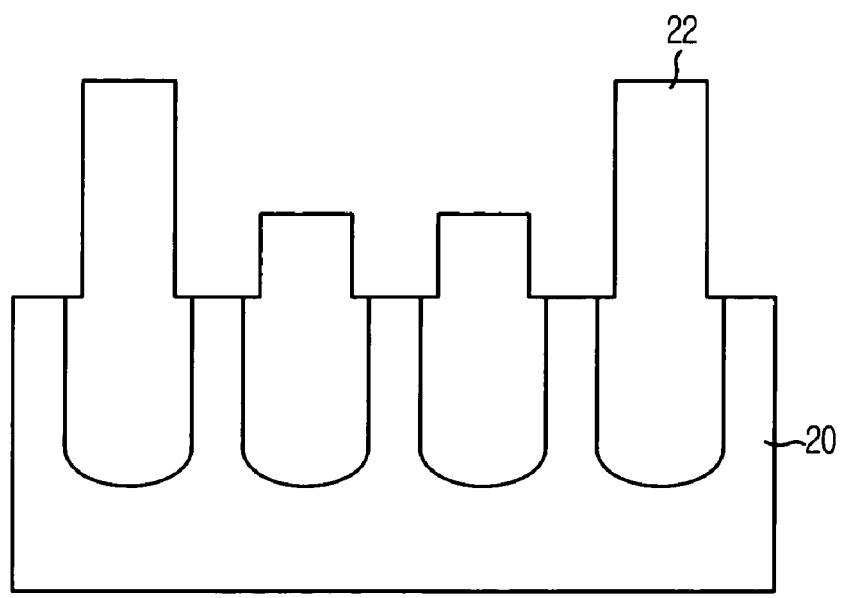

Furthermore, as shown in FIG. 2E, a remaining portion of the nitride layer 21 is completely removed by wet or dry etching.

Figure 2F:
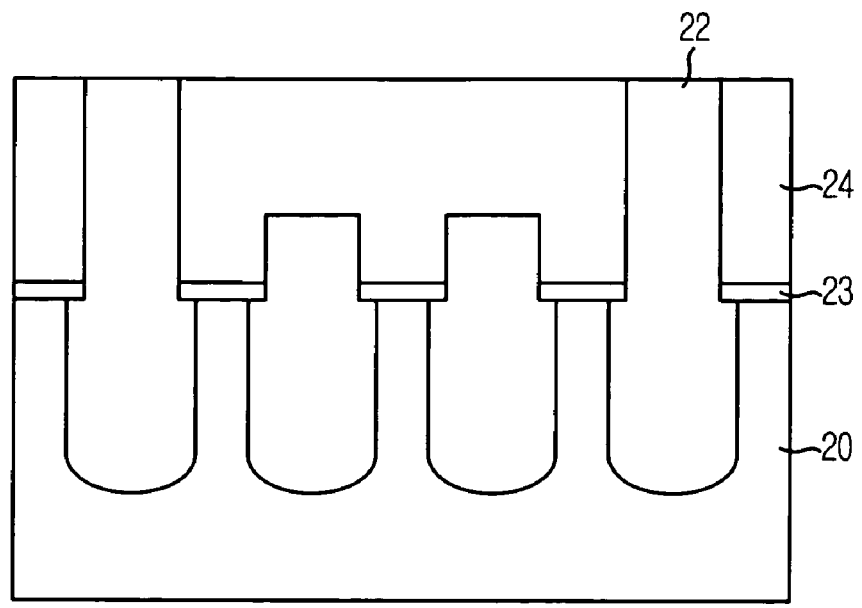

Then, as shown FIG. 2F, a gate oxide layer 23 and a first conductive layer 24 for use in a floating gate are sequentially formed on the above resulting substrate structure where the nitride layer 21 had been completely removed, and a CMP process is performed until the gate oxide layer 23 and the first conductive layer 24 are isolated. Hereinafter, the isolated first conductive layer 24 is referred to as the floating gate.

Figure 2G:
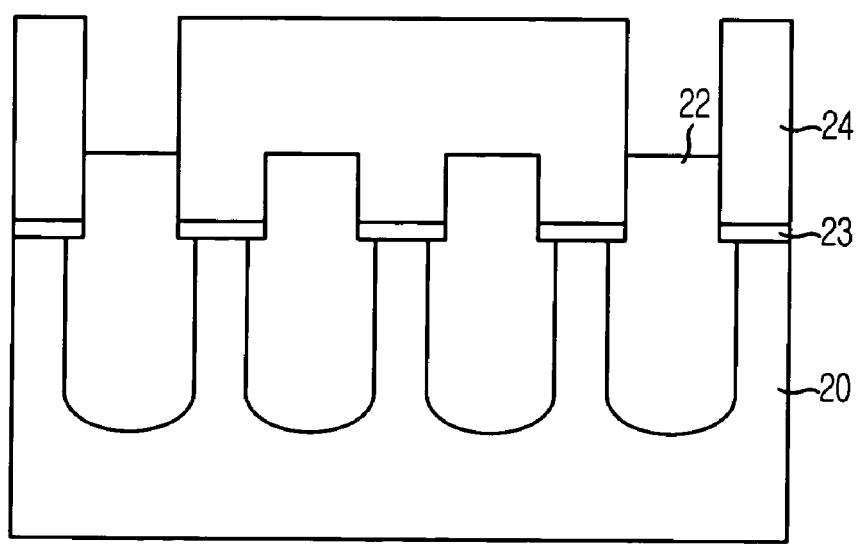

Next, as shown in FIG. 2G, predetermined portions of the device isolation insulation layer 22 are removed by wet or dry etching to increase an effective area of the individual floating gate 24.

Figure 2H:
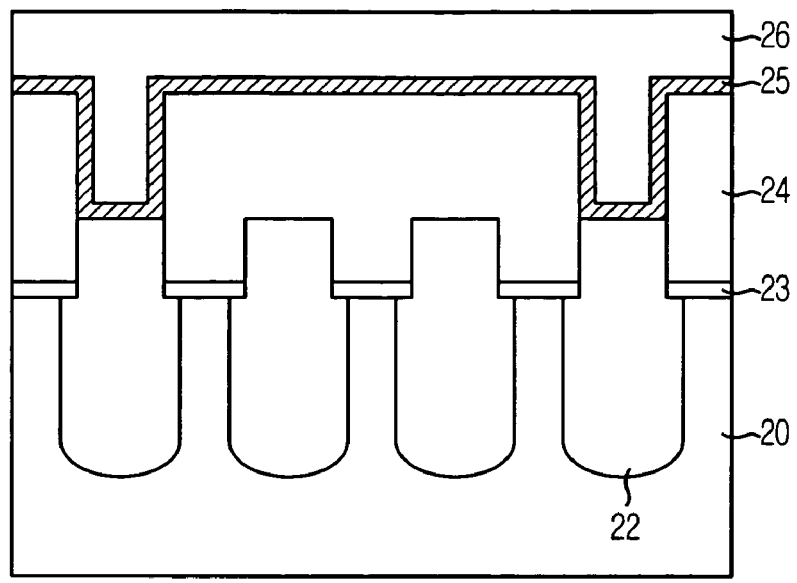

Subsequently, as shown in FIG. 2H, an oxide-nitride-oxide (ONO) layer 25 and a capping conductive layer 26 are sequentially formed on the above resulting substrate structure where the portions of the device isolation insulation layer 22 had been removed.

Figure 2I:
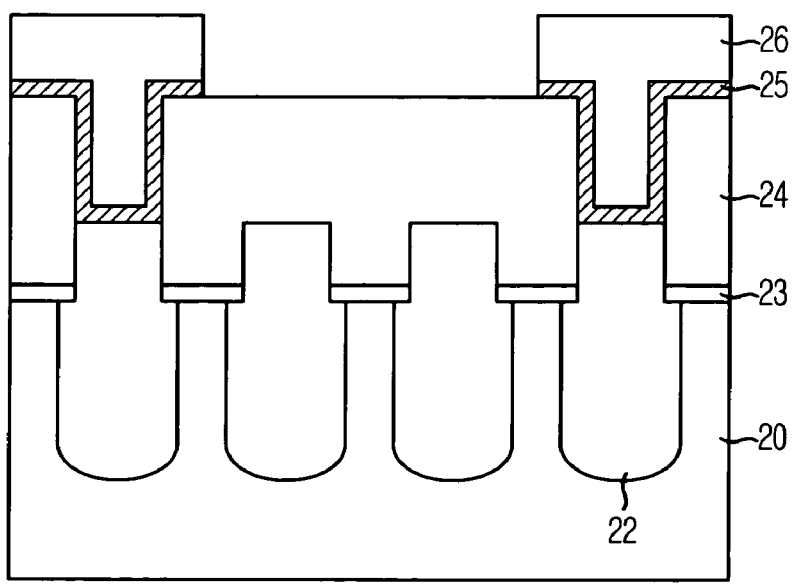

Furthermore, as shown FIG. 2I, photoresist patterns, although not illustrated, are formed on certain portions of the above resulting substrate structure to remove a predetermined portion of the ONO layer 25 formed over the regions on which the selecting lines are to be formed. Then, the predetermined portion of the capping conductive layer 26 and the ONO layer 25 is removed by wet or dry etching.

Figure 2J:
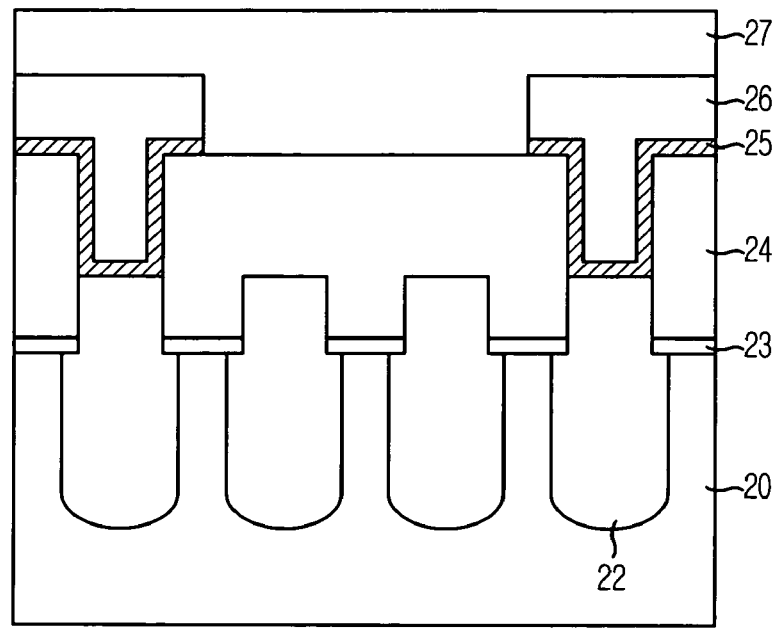

Moreover, as shown in FIG. 2J, a second conductive layer 27 for use in a control gate is formed on the above resulting substrate structure.

Figure 2K:
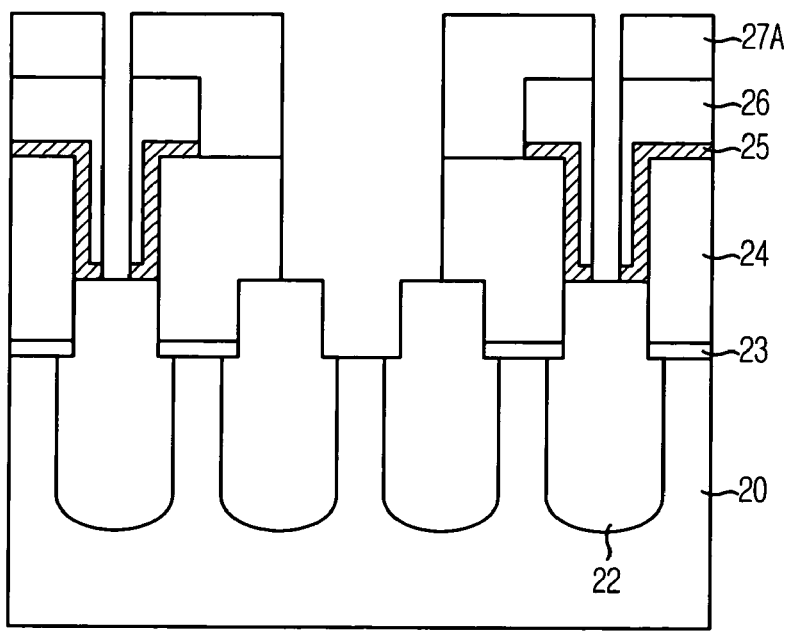

Next, as shown in FIG. 2K, photoresist patterns, although not illustrated, for use in gate line formation are formed on the second conductive layer 27, and then gate structures are formed by dry etching. Herein, a reference numeral 27A denotes a control gate.

In accordance with an embodiment of the present invention, the ONO layer residue, which is a chronic limitation, can be easily removed, and thus the device characteristic can be greatly improved. Also, the development period can be shortened because the removal of ONO layer can be resolved easily, and thus a contribution can be made to the device yield improvement.

This invention is also applicable to an embodiment wherein the ONO layer, used for forming a capacitor, is replaced with some other material.

The present application contains subject matter related to the Korean patent application No. KR 2005-0036272, filed in the Korean Patent Office on Apr. 29, 2005, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. A method for forming a gate structure in a flash memory device, comprising:
    forming device isolation insulation layers passing through an insulation layer and a substrate;
    removing a predetermined portion of the insulation layer and the device isolation insulation layers after planarizing the device isolation insulation layers until the insulation layer is exposed;
    removing the insulation layer;
    isolating a gate oxide layer and a first conductive layer sequentially formed over the device isolation insulation layers;
    removing portions of the device isolation insulation layers to increase an effective area of the first conductive layer;
    forming a laminated layer over the gate oxide layer and the first conductive layer that are isolated;
    removing a predetermined portion of the laminated layer;
    forming a second conductive layer over a remaining portion of the laminated layer, filling a gap created by removing the predetermined portion of the laminated layer; and
    removing predetermined portions of the second conductive layer, thereby forming gate structures.

2. The method of claim 1, wherein the insulation layer includes a nitride material.

3. The method of claim 1, wherein the forming of the device isolation insulation layers includes:
    forming the insulation layer on a substrate;
    removing portions of the insulation layer and the substrate through performing a photolithography process;
    forming a device isolation insulation material over remaining portions of the insulation layer and the substrate; and
    planarizing the device isolation insulation material until the insulation layer is exposed.

4. The method of claim 2, wherein the planarizing of the device isolation insulation material is performed by employing a chemical mechanical polishing (CMP) process.

5. The method of claim 1, wherein the isolating of the gate oxide layer and the first conductive layer is carried out by performing a planarization process until the device isolation insulation layers are exposed.

6. The method of claim 1, wherein the first conductive layer is for forming a floating gate and the second conductive layer is for forming a control gate.

7. The method of claim 1, wherein the laminated layer includes an oxide-nitride-oxide (ONO) layer and a capping conductive layer.

8. The method of claim 1, wherein the removing of the predetermined portion of the device isolation insulation layers and the insulation layer is performed by employing one of a dry etching process and a wet etching process.

9. The method of claim 1, wherein the removing of the predetermined portion of the laminated layer is performed by employing one of a dry etching process and a wet etching process.

10. The method of claim 1, wherein at the removing of the predetermined portion of the insulation layer and the device isolation insulation layers and at the removing of the predetermined portion of the laminated layer, the predetermined portion corresponds to a region where selecting lines are to be formed.

* * * * *